United States Patent [19]

Schieve

[11] Patent Number: 5,511,180

[45] Date of Patent: Apr. 23, 1996

[54] METHOD AND CIRCUIT FOR DETERMINING THE SIZE OF A CACHE MEMORY

[75] Inventor: Eric W. Schieve, Austin, Tex.

[73] Assignee: Dell USA, L.P., Austin, Tex.

[21] Appl. No.: 43,508

[22] Filed: Apr. 6, 1993

[51] Int. Cl.$^6$ ................................................. G06F 11/00
[52] U.S. Cl. ........................ 395/497.03; 395/445
[58] Field of Search .................. 395/425, 497.03, 395/445

[56] References Cited

U.S. PATENT DOCUMENTS

| | | | |
|---|---|---|---|
| 4,926,314 | 5/1990 | Dhuey | 395/425 |
| 5,003,506 | 4/1991 | Itaya | 395/497.03 |
| 5,129,069 | 7/1992 | Helm et al. | 395/497.03 |
| 5,175,836 | 12/1992 | Morgan | 395/497.03 |
| 5,179,686 | 1/1993 | White | 395/425 |
| 5,287,481 | 2/1994 | Lin | 395/425 |

*Primary Examiner*—David L. Robertson
*Assistant Examiner*—David J. O'Neill
*Attorney, Agent, or Firm*—Henry Garrana; Mark Kahler; Michelle Turner

[57] ABSTRACT

Disclosed are a circuit and method for dynamically determining cache memory size. The method comprises the steps of (1) writing a replacement data pattern into a first addressable location of a cacheable portion of addressable space, thereby placing the replacement data pattern into a corresponding first addressable location in a cache memory and setting a tag in the first addressable location, (2) accessing an assumed number of remaining addressable locations in the portion of the addressable space thereby setting tags in each of the remaining addressable locations and (3) reading the first addressable location in the cache memory to determine whether the replacement data pattern remains in the first addressable location, the cache memory being of an assumed size if the replacement data pattern is not in the first addressable location in the cache memory. The circuit and method are able to size cache memory without reference to cache size data stored in cache controllers or hardware timers.

22 Claims, 1 Drawing Sheet

METHOD AND CIRCUIT FOR DETERMINING THE SIZE OF A CACHE MEMORY

TECHNICAL FIELD OF THE INVENTION

The present invention is directed in general to diagnostics for computer memories and, more specifically, to a process for detecting and determining the storage capacity (or size) of cache memory in a personal computer.

BACKGROUND OF THE INVENTION

A cache memory is fast memory that resides logically between a microprocessor and main system memory. The purpose of cache memory is to speed up memory access. A cache memory is typically small relative to main memory because it consists of relatively expensive memory modules. If all of a main system memory could be constructed out of the same fast memory used for cache memory, there would not be a need for a cache memory. Cache memory is therefore an efficient, cost-effective way of using a small amount of very fast memory to optimize overall memory access speed.

Management logic within a cache memory controller coupled to the cache memory keeps track of data most recently accessed from main memory and keeps those data locally in the cache memory. To accomplish this, the cache memory controller employs a directory to tag each datum within the cache memory as having or not having been read. This directory allows the cache memory controller to determine when new data should be read from main memory into the cache memory. For different architectures of cache memories, the data may reside only in the cache memory, or it may reside both in the cache memory and in main memory.

When using a cache memory within a computer system, there is a need to determine the size of (commonly referred to as "sizing") the cache memory prior to testing the cache memory with a diagnostics routine. Sizing a cache memory is an involved process, since it is difficult to determine if the processor is accessing an element that is in the cache memory or if the processor is actually accessing main memory, because a quickly-responding read from main memory appears to the processor similar to a cache memory read.

Prior art methods for discerning differences between a cache memory access from a main memory access have used timing methods. Generally, an access to cache memory is faster than an access to main memory. However, timing is awkward when the diagnostics routine is embedded, rather than disk-based, since there are a multitude of different speeds of processors that can reside in the system and, if the diagnostics routine does not use software timing loops, the routine must rely upon hardware-based system timers, producing added hardware dependencies.

There are several types of cache memory management techniques employed in cache memory controllers. One technique is direct-mapping, wherein the cache memory operates in a linear address space. Within a direct-mapped cache memory, there is a single unique location in the cache memory where a piece of data may reside. Another technique is multi-way (or "X-way") set association, wherein the cache memory consists of a number of pages (each page is termed a "way") of address space so, for a given address in main memory, that address could reside in any one of several places within the cache memory.

For example, in a four-way set associative cache memory, any address in main memory could reside in one of four locations in the cache memory. There is an advantage to this configuration for software that performs nonsequential operations (such as addressing operations that jump back and forth between noncontiguous pieces of the address space). For example, if addresses A and B have the same address offset in the cache memory, in a direct-mapped cache memory, if the processor is repeatedly accessing locations A and B in the loop very rapidly, then these locations will continuously replace each other within the cache memory, and the cache memory is not going to yield a satisfactory performance advantage. However, in an X-way set associative cache memory, if two locations with the same offset are being repetitively called and accessed, those two locations can simultaneously exist in the cache memory without replacing each other, and the cache memory delivers greater performance benefit to the system.

For a cache memory sizing algorithm to be most useful, it should size the cache memory each time diagnostics routines are executed, prior to cache memory static random access memory ("SRAM") and cache memory controller tests. The cache memory sizing is performed each time the diagnostics routines are executed because: (a) the actual cache memory hardware may have been physically replaced with a different size cache memory, or (b) the cache memory hardware may have become faulty since the last time it was tested.

Cache memory sizing may also be employed as a form of error detection, and not just a prerequisite to the diagnostics. In other words, if access is available to a hardware configuration setting in the system that indicates how large the cache memory should actually be, then a comparison of the cache memory size detected by the sizing algorithm with the hardware configuration can lead to the immediate detection of faults. For example, if some hardware configuration setting indicates that the cache memory should be 128 kilobytes ("K") in size and the software cache memory sizing procedure indicates the cache memory is only 64K, then the system should prompt the user to the discrepancy before proceeding to other cache memory tests at that point.

Sizing the cache memory is necessary because subsequently-employed cache memory testing routines need to fill the entire cache memory space with data patterns and perform accesses to thereto. In the past, sizing of the cache memory has been accomplished by firmware and software via some kind of hardware indicator, especially basic input/output system ("BIOS") firmware. BIOS firmware is very hardware-specific, therefore it can make assumptions about the type of system it is running on, e.g., it can recognize that there is a cache memory controller type "A" in a particular system and, with this particular manufacturer's controller, there are data in the controller's addressable memory that indicate the size of the cache memory. Because it is aware of the target hardware, BIOS can look at hardware indicators and specify the size of the cache memory.

The same procedure is typically performed with a disk-based diagnostic. The diagnostic identifies the particular type of system that it is executing upon and then, via table look-up, determines what type of cache memory controller is used within the system and then looks at a hardware indicator that specifies the size of the cache memory.

However, there is not a known firmware or software method that dynamically sizes a cache memory. An advantage to dynamically determining the size of the cache memory is to have a generic piece of firmware that can identify the cache memory without having to rely on hardware indicators. The code thus becomes more portable and more flexible. As an example, embedded diagnostic codes are built for a particular type of system that is produced with one size of cache memory. At some later date, one or more larger sizes of cache memories may be added to this system. However, it is unknown what the hardware indicators will look like, i.e., the data that specify the size of those cache memories, since that logic has not yet been configured at the time the original code is designed. Therefore, a problem arises once those additional larger sizes of cache memories are built, since the original diagnostics code will have to be modified to accommodate the larger cache memories. This is a concern because the diagnostics code has been previously embedded in firmware in the user's system, yet that firmware must be adaptable to user-installed increases in cache memory. An upgrade of the diagnostics code in the field would be required if a larger cache memory than the diagnostics code could handle were employed. Thus, a flash diskette and a BIOS and diagnostics code upgrade would have to be sent to the user along with the upgraded cache memory.

Accordingly, what is needed is a dynamic procedure that will size a cache memory completely independent of the type of cache memory controller and cache memory management technique employed.

SUMMARY OF THE INVENTION

To overcome the above-discussed deficiencies in the prior art, it is a primary object of the present invention to provide a diagnostics routine for sizing cache memory via software. Accordingly, the present invention encompasses a method of determining cache memory size comprising the steps of (1) writing a replacement data pattern into a first addressable location of a cacheable portion of addressable space, thereby placing the replacement data pattern into a location in a cache memory corresponding to the first addressable location of the cacheable portion of addressable space and tagging the corresponding first addressable location in the cache memory; (2) accessing an assumed number of remaining addressable locations in the portion of the addressable space thereby setting tags in each of the remaining addressable locations and (3) reading the first addressable location in the cache memory to determine whether the replacement data pattern remains in the first addressable location, the cache memory being of an assumed size if the replacement data pattern is not in the first addressable location in the cache memory.

Another object of the present invention is to flush the cache memory prior to sizing it. Therefore, the method of the present invention begins with the step of filling the cache memory with a single value to thereby flush the cache memory prior to performing the writing step.

To make sure that the replacement data pattern is different from the original data pattern that existed in addressable space prior to the performing the writing step, the present invention further comprises the step of reading an original data pattern from the first addressable location in a cacheable space and making the replacement data pattern logically complementary to the original data pattern read from the first addressable location.

In its preferred embodiment, the present invention makes use of a table of expected cache sizes, entries in that table being predetermined numbers representing trial cache sizes for use in the sizing process. The process starts with a relatively small trial cache size and, if the cache is determined to be larger than that relatively small trial size, a larger predetermined number is chosen and the process repeated until the first addressable location fails to contain the replacement data pattern.

The present invention requires cacheable addressable space to operate. It does not, however, require that the addressable space be occupied with read/writable memory. Thus, the addressable space may comprise read-only memory ("ROM") or may have no memory at all (an empty space).

Another principal object of the present invention is to provide a cache memory sizing routine that is flexible, not having to rely on hardware switches or specific cache management logic. Therefore, the present invention operates in conjunction with direct-mapped cache memories and X-way set associative write-through cache memories, among others. In line with this flexibility, the present invention may be either embedded in read-only memory ("ROM") or disk-based.

In the attainment of the foregoing objects, the preferred embodiment of the present invention is a method of determining cache memory size in a computer system, comprising the steps of:

(a) filling the cache memory with a single value to thereby flush the cache memory, (b) reading an original data pattern from a first addressable location in a cacheable space in the computer system, (c) writing a replacement data pattern to the first addressable location, the step of writing causing the replacement data pattern to be written into a corresponding location within the cache memory, thereby tagging the corresponding location, (d) selecting a predetermined number representing a trial cache size, (e) accessing data patterns in a predetermined number of addressable locations contiguous to the first addressable location, the accessing tagging contiguous corresponding locations within the cache memory, (f) testing the first addressable location to determine whether the first addressable location still contains the replacement data pattern and (g) selecting a larger predetermined number and repeating steps (a) through (f) until the first addressable location fails to contain the replacement data pattern.

The foregoing has outlined rather broadly the features and technical advantages of the present invention so that the detailed description of the invention that follows may be better understood. Additional features and advantages of the invention will be described hereinafter and also constitute the subject of the claims of the present invention. Those skilled in the art should appreciate that the concepts and the specific embodiment disclosed may be readily used as a basis for modifying or designing other structures employing the principles of the present invention. Those skilled in the art should also realize that such equivalent constructions do not depart from the spirit and scope of the invention as set forth in the appended claims,

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
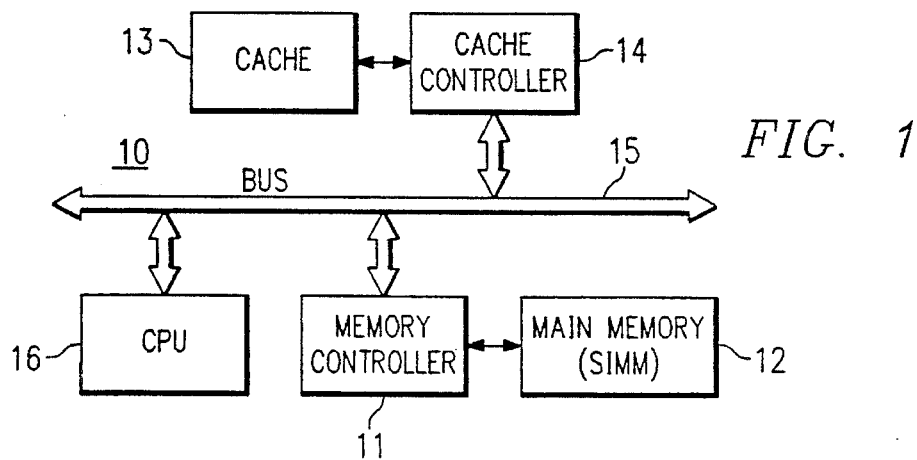
FIG. 1 illustrates a system in which the present invention may be embodied.

Referring to FIG. 1, there is shown a partial diagram of typical computing system 10. As these systems are well known in the art, only the portions of system 10 pertinent to the present invention will be discussed.

System 10 includes system bus 15 that interconnects central processing unit ("CPU") 16 to memory controller 11, main memory 12, cache memory controller 14 and cache memory 13. As needed, CPU 16 will access main memory 12 through memory controller 11, and cache memory 13 through cache memory controller 14.

In its preferred embodiment, the present invention uses unavailable non-read-writable address space (e.g., either system ROM or a part of the system's addressable space that does not have either system random access memory ("RAM") or ROM residing in that space) in the system to try to detect a cache memory hit from a cache memory miss. This bus space is, on an Extended Industry-Standard Architecture ("EISA") system, the address space above and beyond the end of system memory but still within the addressable space of the microprocessor. Those addressed cycles by the CPU are not handled by main memory or ROM, but would merely go to the EISA bus and be defaulted —in other words not responded to —by any component. A write executed to this bus space and then read back is not to a real read-writable location. Only one such nonwritable word location is required within the system, but it has to be a cacheable location, i.e., the system must be able to reflect the addressable space in the cache memory to be sized.

The processor of the present invention begins by reading an original data pattern from a first location (termed "location 0") within a portion of the addressable space into the processor. Next, the processor writes the logical complement of that original data pattern into the first location (the replacement data pattern). This writing sets a tag within the cache memory, labeling the corresponding first location in cache memory as most recently used.

The processor then accesses (either reads or writes) subsequent data patterns from contiguous locations in the addressable space for locations 1 through N, N being a trial cache memory size. This should fill tag all corresponding locations in the cache memory plus 1 if that cache memory is of size N. The last access should then knock out the least recently used element in the cache memory (location 0, containing the complementary, replacement data pattern). If the trial cache memory size N is actually the size of the cache memory, then that least recently used element is location 0. The next step in the process is to read from location 0 and compare what is read to what was previously written to location 0. If the element at location 0 has changed, then that indicates that the cache memory size is equal to the trial cache memory size. If the element at location 0 has not changed, then the cache memory size has not been determined, and the process is repeated for the next larger trial cache memory size.

Figure 2:
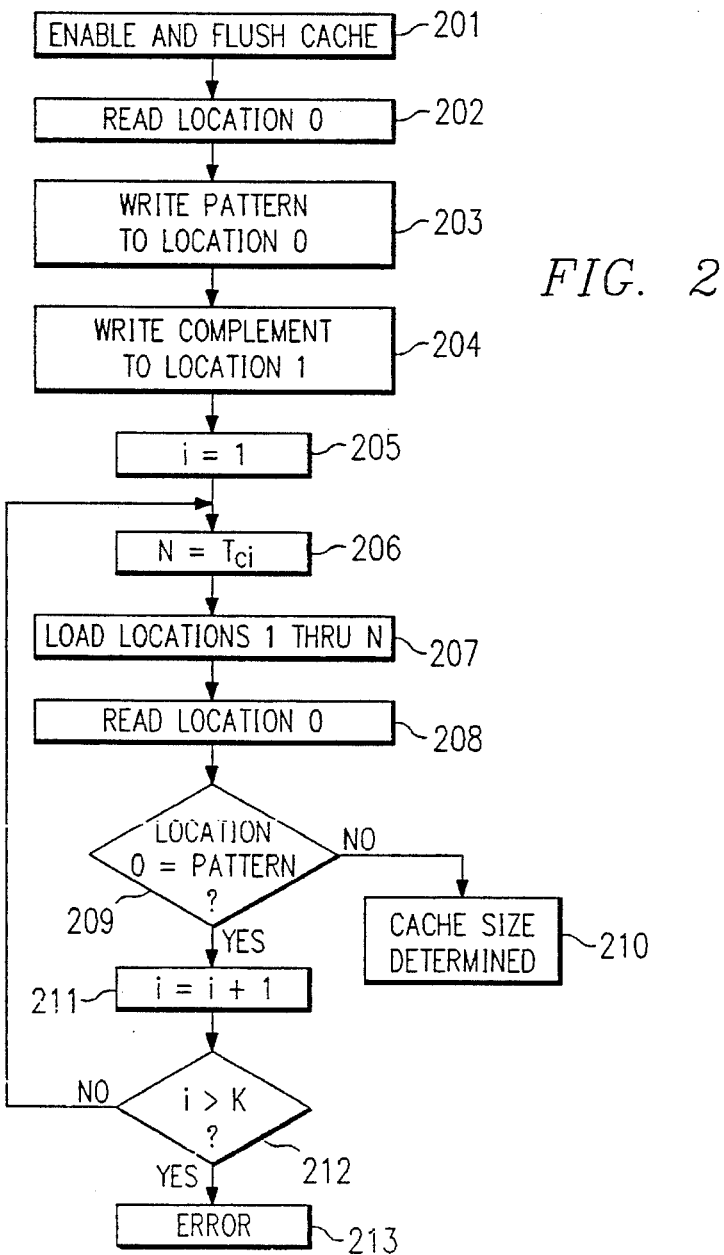
FIG. 2 illustrates a flow diagram for the method of sizing cache memory of the present invention.

Accordingly, FIG. 2, illustrates a flow diagram of the process of the present invention that is implemented within system 10. The process uses a table of trial cache memory sizes, $T_{Ci}$. Cache memories are typically configured in certain common increments, e.g., 8K, 32K, 64K, 128K, 256K, etc. The trial sizes are tabulated in ascending order:

| | |
|---|---|
| $T_{C1}$ | 8K |
| $T_{C2}$ | 32K |
| $T_{C3}$ | 64K |
| $T_{C4}$ | 128K |
| $T_{C5}$ | 256K |

The process begins with the first smallest trial cache memory size from the table, $T_{Ci}$=8K. If the process is unable to detect the cache memory size, it proceeds to the next trial cache memory size in the table, $T_{C2}$. This process is repeated until it detects a cache memory size or until the entire table has been attempted, which in that case, the process returns an error message.

Referring again to FIG. 2, in step 201, cache memory 13 is enabled and flushed in a manner well known in the art. Next, in step 202, the process performs a read from location 0 to set a tag in cache memory 13. The tag designates the order in which locations within cache memory 13 have been accessed.

The next step in the process is step 203, wherein a bit pattern such as "A5A5" is written to location 0. Thereafter, in step 204, the process writes the complement of the pattern written to location 0, "5A5A", to location 1 to flush the bus, in case it has retained any part of the "A5A5" pattern.

At step 205, the process is initialized for the first value within the table of possible cache memory sizes (i=i+1). At step 206, the process begins with the first value within the table, $T_{Ci}$=N=8K. Next, at step 207, the process loads locations 1 through N (8K locations) of cache memory 13. Given that location 0 was tagged as the first element in cache memory 13, then if cache memory 13 is actually N=8K elements, the last location should actually be addressed as N−1. Therefore, the loading of locations 1 through N should actually load one more location than the maximum size of cache memory 13, thus removing the bit pattern that was written in location 0.

The next step in the process, step 208, reads from location 0 again. At step 209, the data read from location 0 is compared to the replacement data pattern, "A5A5", that was originally written to that location. If the two data patterns are equal, then the size of cache memory 13 has not been detected —the cache memory size must actually be larger than N=8K words. If location 0 has changed (the data patterns are not equal) then a miss has been detected and the size of cache memory 13 has been determined as being less than or equal to size N, in this case 8K (step 210).

If in step 209, the data read from location 0 is equal to the replacement data pattern, "A5A5", the process proceeds to step 211 wherein the pointer in the cache memory size table is incremented by one (i=i+1). Thereafter, at step 212, the process checks if the last value in the table has been previously employed within the process. If the last value in the table has been previously employed the process returns an error condition at step 213, since the cache memory size has not been determined to be within any of the proposed sizes. If there remain valid cache memory sizes in the table, then the process returns to step 206 to choose the next trial cache memory size (i=i+1) and execute the process again for the new table value, that in this example would be $T_{C2}$=64K. This is continued through each trial size within the table until a cache memory size is determined or until the entire table has been tested. At each trial size, if step 209 discerns that the bit pattern at location 0 has changed, then this determines that the cache memory size is between the previous trial cache memory size and the trial cache memory size currently under test.

The method of the present invention requires that this operation be performed on trial cache memory sizes so that the algorithm may be generically used for write-through cache memories, e.g., X-way set associative cache memories and direct-mapped cache memories. Therefore, the part of the process that loads locations 1 through N is used so that the process is functional for X-way set associative cache memories that implement least-recently-used ("LRU") and pseudo LRU replacement algorithms. In this manner, by the time location N is read, location 0 will have been the least recently used location and that is accomplished by loading locations 1 through N. Computer systems commonly use replacement algorithms that determine what data a cache memory decides to keep in its directory. These replacement algorithms determine how a cache memory removes stale data and which stale data to remove.

An alternative embodiment of the present invention uses a slight modification to the method by adding elements to the trial cache memory size table that are not equal to the expected cache memory sizes, but are equal to one word less than the trial cache memory size. For example, if the trial cache memory sizes are as stated previously, the table may be expanded as follows: 0K, 8K–1, 8K, 32K–1 and 32K. With this configuration, the size of cache memory 13 could be detected more accurately, i.e. the size of cache memory 13 could be determined to be exactly 8K or 32K and not merely determined to be between 8K and 32K. Any other combination of table values could be implemented to suit the needed accuracy of the process.

From the above, it is apparent that the present invention is the first to provide a method of determining cache memory size, comprising the steps of (1) writing a replacement data pattern into a first addressable location of a cacheable portion of addressable space, thereby placing the replacement data pattern into a corresponding first addressable location in a cache memory and setting a tag the first addressable location, (2) accessing an assumed number of remaining addressable locations in the portion of the addressable space thereby setting tags in each of the remaining addressable locations and (3) reading the first addressable location in the cache memory to determine whether the replacement data pattern remains in the first addressable location, the cache memory being of an assumed size if the replacement data pattern is not in the first addressable location in the cache memory.

Although the present invention and its advantages have been described in detail, those skilled in the art should understand that various changes, substitutions and alterations can be made herein without departing from the spirit and scope of the invention as defined by the appended claims.

What is claimed is:

1. A method of determining cache memory, comprising the steps of:

writing a replacement data pattern to a first addressable location of a cacheable portion of addressable space, thereby placing said replacement data pattern into a corresponding first addressable location in said cache memory and tagging said corresponding first addressable location in said cache memory;

accessing a first predetermined number of remaining addressable locations in said cacheable portion of addressable space, thereby tagging corresponding remaining addressable locations in said cache memory; and reading said corresponding first addressable location in said cache memory to determine whether said replacement data pattern remains in said corresponding first addressable location in said cache memory, said chache memory being of a first perdetermined size if said replacement data pattern is not in said corresponding first addressable location in said cache memory.

2. The method as recited in claim 1 further comprising the step of filling said cache memory with a single value to thereby flush said cache memory prior to said writing step.

3. The method as recited in claim 1 wherein said step of writing further comprises the step of reading an original data pattern from said first addressable location of said cacheable portion of addressable space.

4. The method as recited in claim 1 wherein said replacement data pattern is logically complementary to an original data pattern read from said addressable location of said cacheable portion of addressable space.

5. The method as recited in claim 1 wherein said first predetermined number represents a trial cache memory size.

6. The method as recited in claim 1 further comprising the step of selecting a predetermined number larger than said first predetermined number and repeating said method for determining the size of said cache memory until said corresponding first addressable location in said cache memory fails to contain said replacement data pattern.

7. The method as recited in claim 1 wherein said addressable space comprises read-only memory (ROM).

8. The method as recited in claim 1 wherein said addressable space does not contain computer memory.

9. A circuit for indirectly determining the size of a cache memory in a computer, comprising:

a cacheable portion of addressable space within a memory subsystem in said computer whereby data located in said cacheable portion of addressable space may be loaded into said cache memory; and a microprocessor for writing a replacement data pattern to an addressable location in said cacheable portion of addressable space, said replacement data pattern being loaded into a corresponding addressable location in said cache memory, said microprocessor accessing a first predetermined number of remaining addressable locations in said cacheable portion of addressable space, said accesses causing a loading of subsequent data patterns from said cacheable portion of addressable space into said cache memory, said cache memory thereby read to determine whether said replacement data pattern remains in said corresponding addressable location in said cache memory.

10. The circuit as recited in claim 9 wherein said cache memory is filled with a single value to thereby flush said cache memory prior to said replacement data pattern being loaded into said corresponding addressable location in said cache memory.

11. The circuit as recited in claim 9 wherein an original data pattern is read from said addressable location in said cacheable portion of addressable space.

12. The circuit as recited in claim 9 wherein said replacement data pattern is logically complementary to an original data pattern read from said [first]addressable location in said cacheable portion of addressable space.

13. The circuit as recited in claim 9 wherein said first predetermined number represents a trial cache memory size.

14. The circuit as recited in claim 9 wherein said microprocessor selects a second predetermined number larger than said first predetermined number, said microprocessor continuing to determine the size of said cache memory by accessing a second predetermined number of remaining addressable locations in said cacheable portion of addressable space, said accesses again causing a loading of subsequent data patterns from said cacheable portion of addressable space into said cache memory, said cache memory thereby read to determine whether said replacement data pattern remains in said corresponding addressable location in said cache memory.

15. The circuit as recited in claim 9 wherein said addressable space comprises read-only memory (ROM).

16. The circuit as recited in claim 9 wherein said addressable space does not contain computer memory.

17. A method of determining the size of a cache memory in a computer system, comprising the steps of:

(a) filling said cache memory with a single valve to thereby flush said cache memory;

(b) reading an original data pattern from a first addressable location in a cacheable portion of addressable space in said computer system;

(c) writing a replacement data pattern to said first addressable location in said cacheable portion of addressable space, said step of writing causing said replacement data pattern to be written into a corresponding first addressable location in said cache memory, thereby tagging said corresponding first addressable location in said cache memory;

(d) selecting a first predetermined number representing a trial cache size;

(e) accessing data patterns in other addressable locations contiguous to said first addressable location in said cacheable portion of addressable space equalling said first predetermined number, thereby tagging contiguous corresponding addressable locations in said cache memory;

(f) testing said corresponding first addressable location in said cache memory to determine whether said corresponding first addressable location in said cache memory still contains said replacement data pattern; and (g) selecting a second predetermined number larger than said first predetermined number and repeating steps (a) through (f) until said corresponding first addressable location in said cache memory fails to contain said replacement data pattern.

18. The method as recited in claim 17 wherein said addressable space comprises read-only memory (ROM).

19. The method as recited in claim 17 wherein said addressable space does not contain computer memory.

20. A circuit for indirectly determining the size of a cache memory in a computer, comprising:

a cacheable portion of addressable space within a memory subsystem in said computer whereby data located in said cacheable portion of addressable space may be loaded into said cache memory under control of a cache controller; and a microprocessor for writing a replacement data pattern to an addressable location in said cacheable portion of addressable space, said replacement data pattern being loaded into a corresponding addressable location in said cache memory, said microprocessor accessing a first predetermined number of remaining addressable locations in said cacheable portion of addressable space, said accesses causing a loading of subsequent data patterns from said cacheable portion of addressable space into said cache memory, said cache memory therby read to determine whether said replacement data pattern remains in said corresponding addressable location in said cache memory, said microprocessor further accessing a second predetermined number larger than said first predetermined number of remaining addressable locations in said cacheable portion of addressable space until said corresponding addressable location in said cache memory fails to contain said replacement data pattern.

21. The circuit as recited in claim 20 wherein said addressable space comprises read-only memory (ROM).

22. The circuit as recited in claim 20 wherein said addressable space does not contain computer memory.

* * * * *